United States Patent

Tang et al.

[11] Patent Number: 5,830,532
[45] Date of Patent: Nov. 3, 1998

[54] METHOD TO PRODUCE ULTRATHIN POROUS SILICON-OXIDE LAYER

[75] Inventors: Shaoping Tang, Plano; Robert M. Wallace, Richardson, both of Tex.; Yi Wei, Chandler, Ariz.

[73] Assignee: Texas Instruments Corporated, Dallas, Tex.

[21] Appl. No.: 819,279

[22] Filed: Mar. 18, 1997

Related U.S. Application Data

[60] Provisional application No. 60/013,538 May 18, 1996.
[51] Int. Cl.⁶ .................................................. C23C 16/40
[52] U.S. Cl. ................... 427/255; 427/255.3; 427/255.4; 427/264; 427/270; 427/271; 438/408; 438/700; 438/770
[58] Field of Search ............................... 427/255.3, 255, 427/255.4, 264, 270, 271, 534; 438/408, 409, 700, 770, 739

[56] References Cited

U.S. PATENT DOCUMENTS

| | | |
|---|---|---|
| 4,044,222 | 8/1977 | Kestenbaum ..................... 219/121 LM |
| 5,422,305 | 6/1995 | Seabaugh et al. ...................... 437/126 |

*Primary Examiner*—Shrive Beck
*Assistant Examiner*—Timothy Meeks
*Attorney, Agent, or Firm*—Christopher L. Maginniss; W. James Brady, III; Richard L. Donaldson

[57] ABSTRACT

A method for producing a porous film on a silicon substrate is described. The substrate 14 is placed in a vacuum chamber in the presence of oxygen at specified pressure and temperature for a period of time to form a thin oxide film 10 thereon. Then the conditions in the chamber are altered so that voids 14 of a desired dimension are formed in the oxide film 10. Alternatively, a substrate 20 is subjected to specific conditions in the vacuum chamber whereat oxide islands 22 nucleate on the surface. As the islands grow, they eventually cover most of the surface leaving voids 24 of the desired size.

3 Claims, 6 Drawing Sheets

VOID FORMATION

OXIDE ISLAND NUCLEATION

METHOD TO PRODUCE ULTRATHIN POROUS SILICON-OXIDE LAYER

This application claims priority under 35 USC § 119(e)(1) of provisional application Ser. No. 60/013,538 filed May 18, 1996.

CROSS-REFERENCE TO RELATED APPLICATIONS

This patent application is related to the following U.S. patent application and patent which have a common assignee: Ser. No. 08/145,267, filed Oct. 23, 1993, and US Pat. No. 5,422,305.

BACKGROUND OF THE INVENTION

The invention relates broadly to electronic devices, and, more particularly, to ultrathin silicon-oxide layers which can be used in forming silicon based resonant tunneling devices and systems.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. Further, Mars et al., Reproducible Growth and Application of AlAs/GaAs Double Barrier Resonant Tunneling Diodes, 11 J. Vac. Sci. Tech. B 965 (1993), and Özbay et al, 110-GHz Monolithic Resonant-Tunneling-Diode Trigger Circuit, 12 IEEE Elec. Dev. Lett. 480 (1991), each use two AlAs tunneling barriers imbedded in a GaAs structure to form a quantum well resonant tunneling diode. The quantum well may be 4.5 nm thick with 1.7 nm thick tunneling barriers.

Attempts to fabricate quantum wells in silicon-based semiconductors, rather than the III–V semiconductors such as AlGaAs and GaAs, have focussed primarily on silicon-germanium alloys. For example, the Topical Conference on Silicon-Based Heterostructures II (Chicago 1992) included papers such as Grützmacher et al., Very Narrow SiGe/Si Quantum Wells Deposited by Low-Temperature Atmospheric Pressure Chemical Vapor Deposition, 11 J. Vac. Sci. Tech. B 1083 (1993) (1 nm wide wells of $Si_{0.75}Ge_{0.25}$ with 10 nm wide Si tunneling barriers) and Sedgwick et al., Selective SiGe and Heavily As Doped Si Deposited at Low Temperature by Atmospheric Pressure Chemical Vapor Deposition, 11 J. Vac. Sci. Tech. B 1124 (1993) (Si/SiGe resonant tunneling diode selectively grown in an oxide window with silicon tunneling barriers each 5 nm wide and a 6 nm wide quantum well of $Si_{0.75}Ge_{0.25}$. Because the valence band offset greatly exceeds the conduction band offset at SiGe/Si interfaces, most investigators consider hole tunneling rather than electron tunneling using strained layer SiGe.

However, SiGe strained layers possess a serious intrinsic impediment in that the band discontinuities are small (less than 500 meV). This precludes room temperature operation with large peak-to-valley curent differences (greater than approximately 5). Further, the addition of a strained heterojunction and new material, germanium, necessitates the undesirable development and implementation of new low temperature fabrication methods to allow production.

Tsu, U.S. Pat. No. 5,216,262, describes a silicon-based quantum well structure with tunneling barriers made of short period silicon/silicon dioxide superlattices of epitaxial silicon dioxide two monolayers thick.

Numerous investigators have studied the silicon/silicon oxide interface because it underlies performance of the currently prevalent CMOS transistor structure of silicon integrated circuits. The growth and analysis of single molecular layers of oxide have become commonplace. For example, Ohmi et al., Very Thin Oxide Film on a Silicon Surface by Ultraclean Oxidation, 60 Appl. Phys. Lett. 2126 (1992); Hattori, High Resolution X-ray Photoemission Spectroscopy Studies of Thin $SiO_2$ and $Si/SiO_2$ Interfaces, 11 J. Vac. Sci. Tech. B 1528 (1993); and Seiple et al., Elevated Temperature Oxidation and Etching of the Si(111) 7×7 Surface Observed with Scanning Tunneling Microscopy, 11 J. Vac. Sci. Tech. A 1649 (1993). The Ohmi et al. article observes that an oxide monolayer formed on a silicon wafer at 300° C. provides the foundation for oxide films superior to standard thermal oxide with respect to Frenkel-Poole emission for thin oxide films.

SUMMARY OF THE INVENTION

The present invention provides an ultrathin porous silicon-oxide layer useful in the production of resonant tunneling diodes and transistors by the specifically defining the parameters for forming a silicon-oxide layer with the desired voids therein.

The ability of being able to form such porous ultrathin silicon-oxide layers has the technical advantage of providing a layer needed in the fabrication of resonant tunneling devices with standard silicon processes.

DETAILED DESCRIPTION OF PREFERRED EMBODIMENTS

Figure 1A:
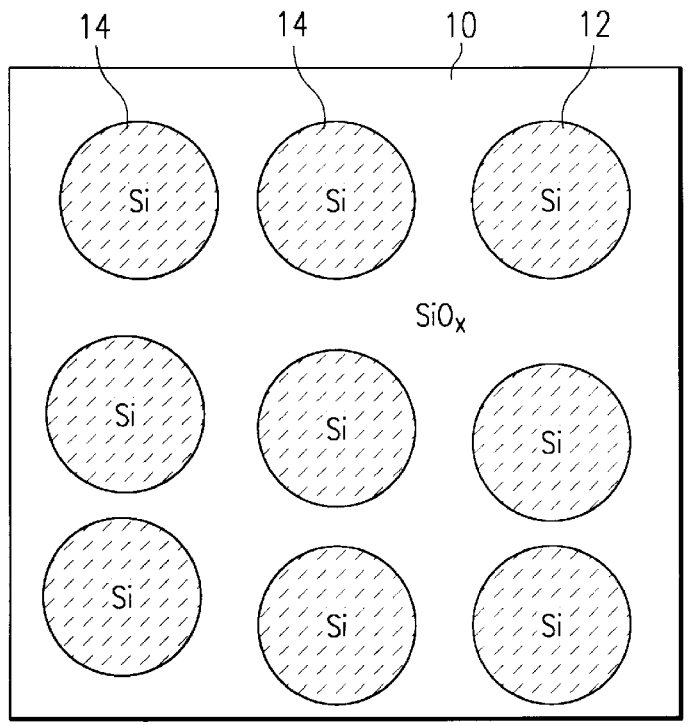
FIGS. 1a and 1b illustrate in plan view a silicon-oxide layer with openings therethrough that extend to the upper surface of the underlying silicon substrate.

FIG. 1 illustrates the two different approaches for forming a porous $SiO_x$ film on a silicon substrate. Generally speaking, the film 10 of FIG. 1(a) is shown in plan view overlying a silicon substrate 12 which is observable through a plurality of voids 14 illustrated as circular areas distributed through the film 10. The actual distribution of the voids 14 in the film 10 is quite random and their cross section is generally, but not exactly, circular in shape. The structure of FIG. 1(a) in essance comprises a thin $SiO_x$ film with a plurality of voids therethrough making the film somewhat porous. This porous film is produced by first forming a thin oxide film over the silicon substrate and then forming voids in the thin film in the manner hereinafter described.

Figure 1B:
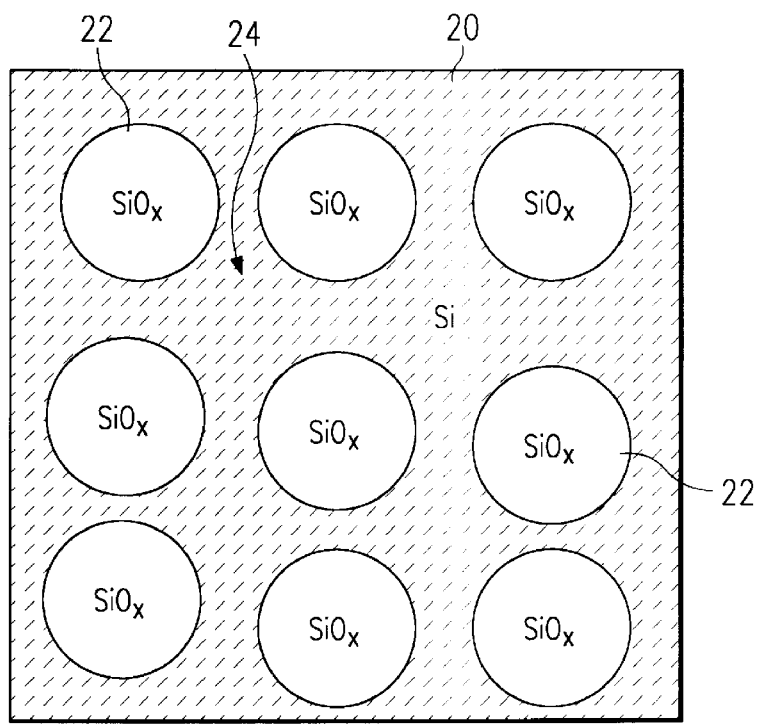

An alternative structure is illustrated in FIG. 1(b). In this arrangement, a silicon substrate 20 has a plurality of $SiO_x$ islands 22 formed thereon. By controling the nucleation of these islands 22, the islands 22 can grow in size until they merge with other islands while leaving voids 24 therebetween so that the substrate 20 will be exposed. This approach will also produce a porous film on a silicon substrate.

Figure 2:
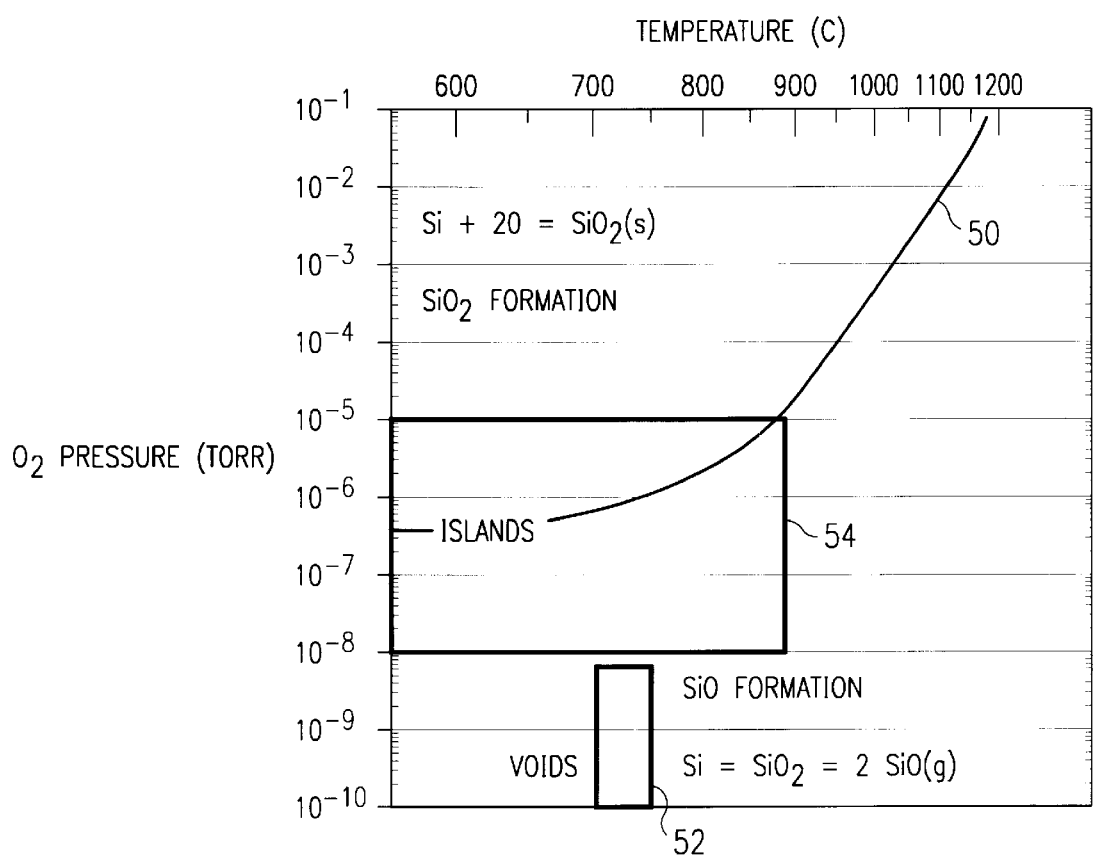
FIG. 2 illustrates the operating parameters used in forming the porous silicon-oxide film of the present invention.

FIG. 2 illustrates the operating parameters for forming films of the type described in FIG. 1. In forming such films, one method according to this invention comprises annealing a clean silicon substrate with a thin oxide (1–3 nm thick) formed thereon in a high vacuum chamber in the presence of oxygen at an elevated temperature for a controlled period of time. The preferred temperature is in the range of between about 700 degrees C. to about 750 degrees C. The preferred partial presssure of oxygen is in the range of about $10^{-8}$ to $10^{-10}$ Torr. Typical exposure time of the oxide covered silicon at these operating conditions is in the order of 0.5 to about 2 minutes during which time a plurality of voids of the desired size will form in the film. For the conditions specified, the voids will extend through the thin oxide film to the substrate and will have a diameter in the range of about 1 to 3 nm. Maintaining these conditions for a longer time period will serve to increase the diameter of the voids.

An alternative approach is to place a clean silicon substrate into a high vacuum treatment chamber in the presence of oxygen under temperature and pressure conditions above and to the left of the line 50 in FIG. 2. This line 50 defines the approximate boundary between conditions above and to the left of the line where $SiO_2$ forms and the conditions below and to the right of the line 50 where SiO forms. Under the conditions above and to the left of the line 50, $SiO_2$ will form on the substrate and if these conditions remain for about 90 seconds, a thin film of oxide will form on the substrate having a thickness of about 1 nm. Once the oxide film grows to a desired thichness in the range of about 1 to about 3 nm, the operating conditions are rapidly changed to those within the rectangular area 52. When this occurs, the silicon substrate and the $SiO_2$ film will react to form SiO which is gaseous at the operating temperatures specified within the area 52.

This produces a plurality of randomly distributed voids in the silicon dioxide film. Once the voids have grown in size to be about 1 to 3 nm in diameter, the void formation can be quickly quenched by rapidly lowering the temperature of the chamber to a temperature outside those in the area 52 such as to room temperature.

Figure 3A:
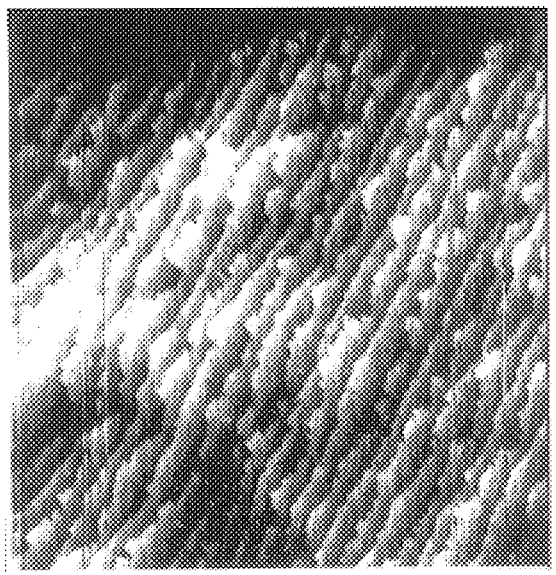
FIGS. 3(a) and 3(b) are scanning tunneling microscope views of atomically clean silicon [100] surface and FIG. 3(c) shows the surface of the substrate after the formation of an oxide film thereon.
Figure 3B:
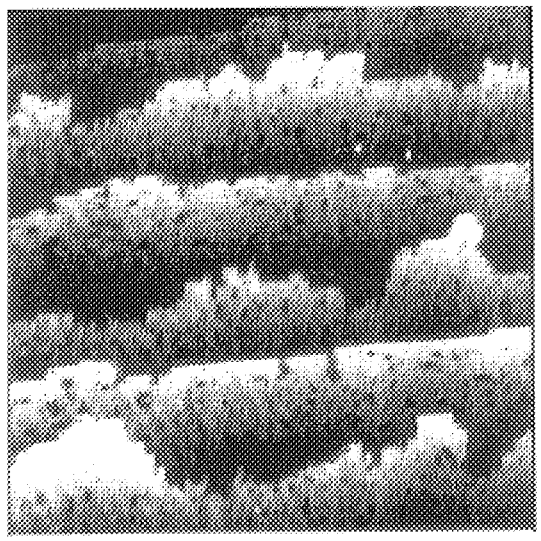
Figure 3C:
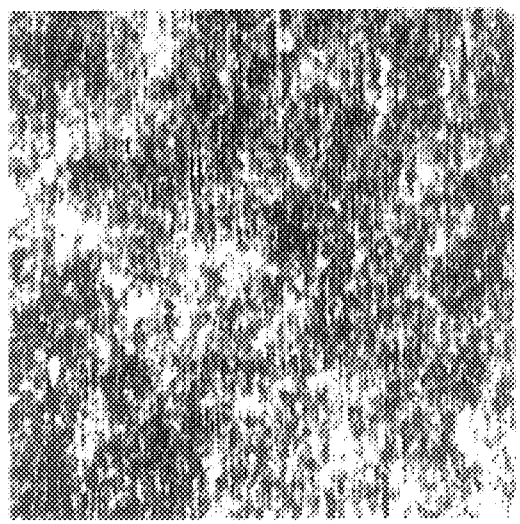

FIGS. 3(a) and 3(b) are scanning tunneling microscope images of atomically clean silicon [100] surface respectively with scan areas of 200 nm×200 nm and 70 nm×70 nm. FIG. 3(c) shows a 200 nm×200 nm area after the surface was oxidized at 650 degrees C. in $5\times10^{-6}$ Torr oxygen for about 90 seconds.

Figure 4A:
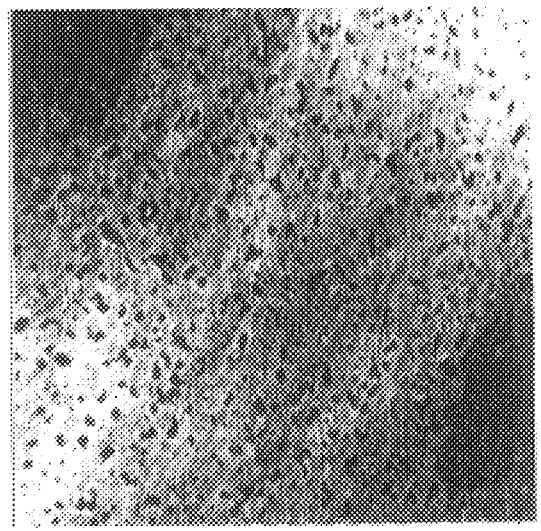
FIGS. 4(a), 4(b) and 4(c) are scanning tunneling microscope views showing the formation of voids in a thin oxide film during annealing under ultra-high vacuum conditions.
Figure 4B:
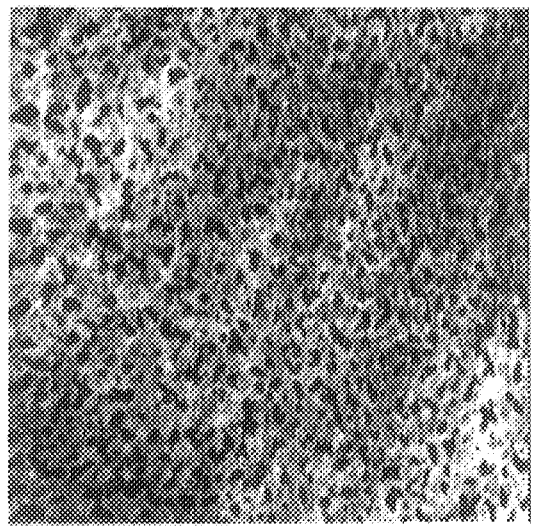
Figure 4C:
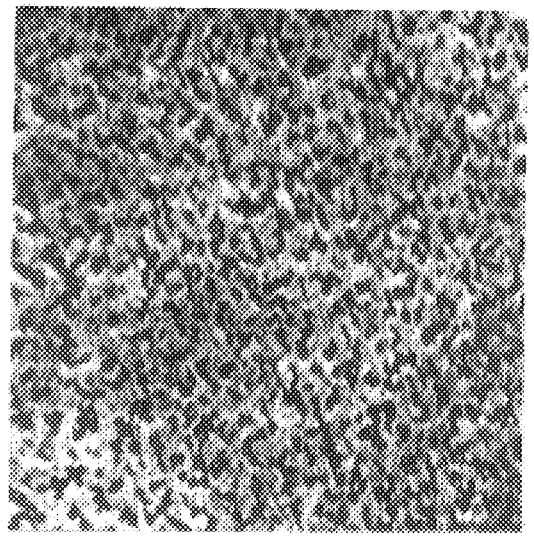

FIGS. 4(a), 4(b) and 4(c) illustration void formation in a thin oxide film after respecitvely 30 sec, 60 sec and 90 sec under conditions within area 52 as shown in FIG. 2.

Figure 6A:
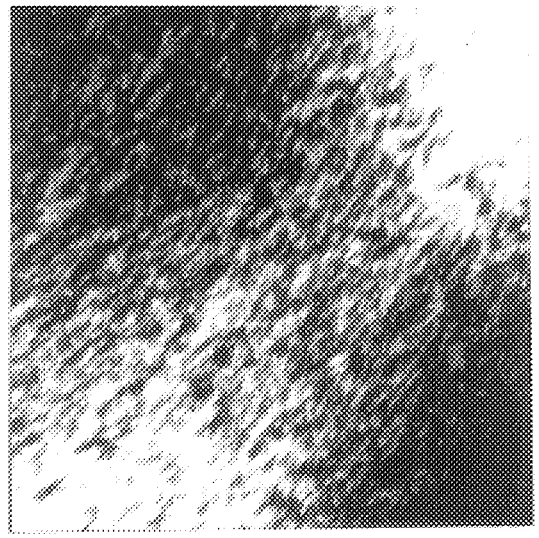
FIGS. 6(a), 6(b) and 6(c) are scanning tunneling microscope images showing the formation of silicon oxide islands.
Figure 6B:
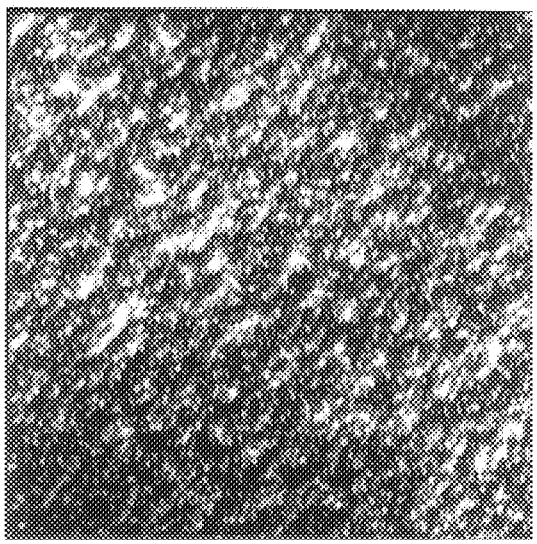
Figure 6C:
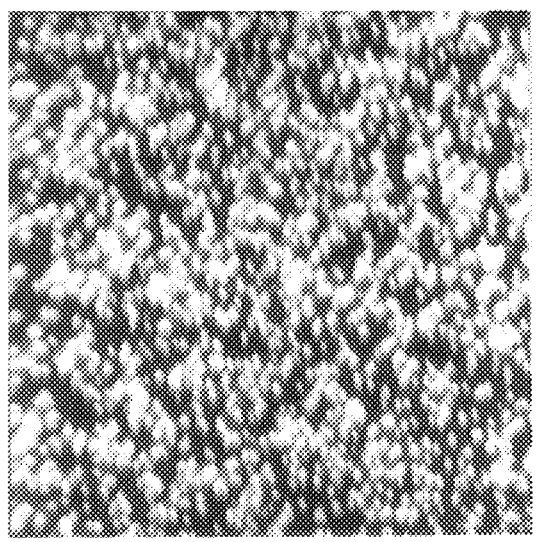

The operating parameters for a second method for forming a thin, porous film are defined by the rectangular area 54 in FIG. 2. This method involves forming oxide pillars or islands on the silicon substrate. A suitably clean silicon substrate is placed in a high vacuum chamber in the presence of oxygen at pressures defined by the rectangular area 54 which are in the range of between about $10^{-5}$ Torr and about $10^{-8}$. Torr. The temperature is adjusted to be in the range of from about 550 degrees C. and 900 degrees C. Typical exposure times under these conditions are in the range from about 5 to 15 minutes. The results of such exposure are illustrated in FIG. 6(a), 6(b) and 6(c) which respectively show the results after 5, 10 and 15 minutes exposure respectively. In FIG. 6, the light areas comprise the islands of $SiO_2$ which form while the black areas comprise the voids between the islands. It is seen that the longer the exposure to these operating conditions, the larger the islands become. Hence, by controling the time that a substrate is exposed to these conditions, the size of resulting voids between islands can be controlled.

Figure 5A:
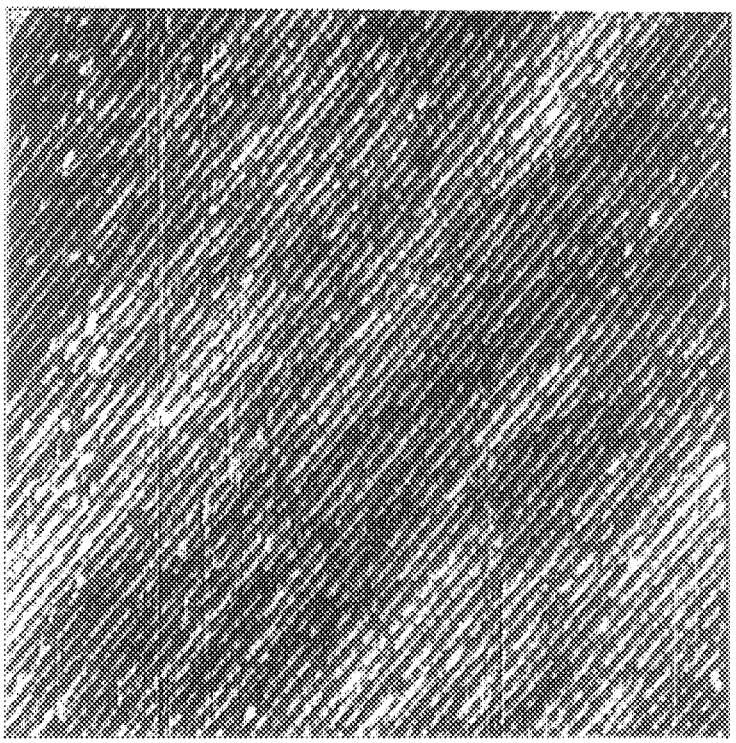
FIGS. 5(a) and 5(b) are scanning tunneling microscope images of clean vicinal Si(100) surface, miscut 4° off [100] toward the [011] direction.
Figure 5B:
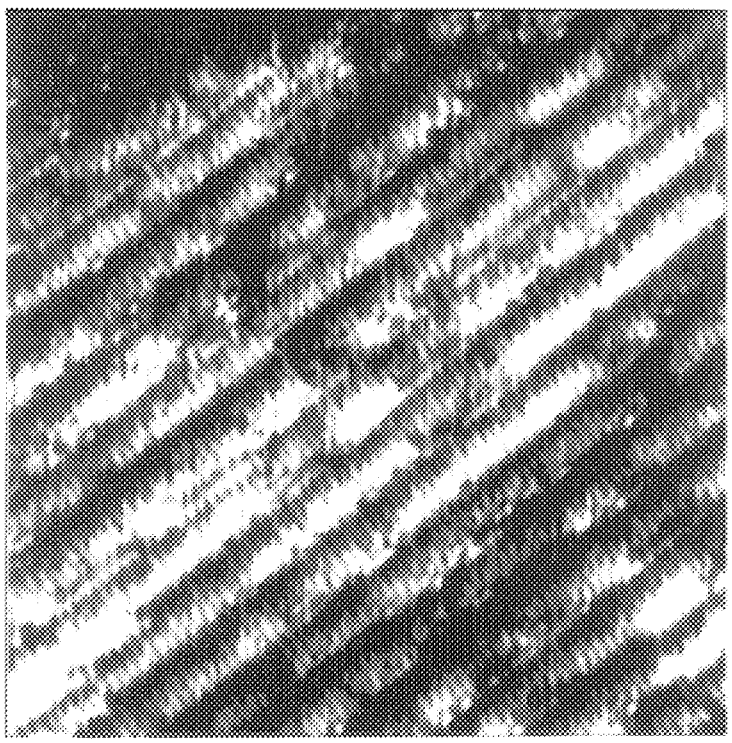

The best results with the second described method for forming a film with voids therein is believed to be achieved when the silicon substrate is prepared in the following manner. One starts with a clean vicinal Si[100] surface miscut 4 degrees off [100] towards [011] direction. The substrate is preferably n-type which has been p-doped, 0.1 ohm cm. The surface of such a substrate is illustrated in FIG. 5(a) and 5(b). These scanning tunneling microscope views show respectively 200 nm×200 nm and 53 nm×53 nm areas. Other substrate preparations may also be utilized in connection with the "island formation" method for producing a porous film.

While the above description has been made with particular emphasis on the preferred embodiments of the present invention, those of skill in the art will recognize that various modifications can be made to the process for making a porous film according to the present description without departing from the spirit and scope of the invention as defined by the following claims.

What is claimed is:

1. A method for forming a porous film on a silicon substrate comprising the steps of:

placing the silicon substrate in a vacuum chamber in the presence of a partial pressure of oxygen and at a vacuum chamber temperature suitable for forming an oxide film thereon;

maintaining said oxygen partial pressure and vacuum chamber temperature until an oxide film of a desired thickness is produced on the silicon substrate;

modifying the partial pressure of oxygen in said vacuum chamber to be between about $10^{-8}$ to about $10^{-10}$ Torr and said vacuum chamber temperature to be between about 700 and 750 degrees C. to cause formation of voids in the oxide film;

maintaining the partial pressure of oxygen between about $10^{-8}$ to about $10^{-10}$ Torr and the vacuum chamber temperature between about 700 and 750 degrees C. for a sufficient time to form voids in the oxide film of a desired dimension; and quenching the void formation by changing the partial pressure of oxygen in the vacuum chamber and vacuum chamber temperature so that neither oxide film formation nor void formation occurs.

2. The method of claim 1 wherein the the partial pressure of oxygen and vacuum chamber temperature suitable for forming said oxide film are maintained for a sufficient time to produce an oxide film having a thickness between 1 and 3 nm thick.

3. The method of claim 1 wherein said partial pressure of oxygen is maintained between about $10^{-8}$ to about $10^{-10}$ Torr and the vacuum chamber temperature is maintained between about 700 and 750 degrees C. for a sufficient time to produce voids in said oxide film having a diameter of about 1 to 3 nm.

* * * * *